US005596431A

United States Patent [19]
Bongaerts et al.

[11] Patent Number: 5,596,431
[45] Date of Patent: Jan. 21, 1997

[54] PLASMA ADDRESSED LIQUID CRYSTAL DISPLAY WITH ETCHED ELECTRODES

[75] Inventors: Petrus F. G. Bongaerts, Waalre; Jacob Bruinink, Eindhoven; Adrianus L. J. Burgmans, Eindhoven; Henri R. J. R. Van Helleputte, Eindhoven, all of Netherlands; Babar A. Khan, Ossining, N.Y.; Karel E. Kuijk, Dommelen, Netherlands

[73] Assignee: Philips Electronics North America Corp., New York, N.Y.

[21] Appl. No.: 413,052

[22] Filed: Mar. 29, 1995

[51] Int. Cl.$^6$ .................. G02F 1/133; G02F 1/1345; G02F 1/13; G09G 3/22
[52] U.S. Cl. .................. 349/32; 345/60; 315/169.4; 365/116; 313/484; 349/149; 349/187
[58] Field of Search .................. 359/54, 87, 88; 345/60; 315/169.4; 365/116; 313/484

[56] References Cited

U.S. PATENT DOCUMENTS

| | | | |
|---|---|---|---|
| 4,896,149 | 1/1990 | Buzak et al. | 340/794 |
| 5,077,553 | 12/1991 | Buzak | 340/794 |
| 5,214,521 | 5/1993 | Kwon et al. | 359/54 |
| 5,244,427 | 9/1993 | Umeya | 445/24 |
| 5,272,472 | 12/1993 | Buzak | 345/60 |
| 5,276,384 | 1/1994 | Martin | 313/582 |
| 5,311,204 | 5/1994 | Nishida | 345/60 |
| 5,400,046 | 3/1995 | Ilcisin et al. | 345/58 |
| 5,408,245 | 4/1995 | Kakizaki | 345/60 |
| 5,420,707 | 5/1995 | Miyazaki | 359/54 |
| 5,453,660 | 9/1995 | Martin et al. | 313/582 |
| 5,461,395 | 10/1995 | Stein | 345/60 |

FOREIGN PATENT DOCUMENTS 0567021  10/1993  European Pat. Off..

OTHER PUBLICATIONS

"Thin Film Processes" edit. by J. L. Vossen and W. Kern, published 1978 by Academic Press, Ch. V-2, pp. 497–556.
Buzak et al., "A 16-Inch Full Color Plasma Addressed Liquid Crystal Display", Digest of Tech. Papers, 1993 SID Int. Symp., Soc. for Info. Disp. pp. 883–886.

Primary Examiner—William L. Sikes
Assistant Examiner—Ron Trice
Attorney, Agent, or Firm—John C. Fox

[57] ABSTRACT

A method for making an electrical device such as a PALC display device, and the electrical device or PALC device so made, in which a channel plate is provided with substantially vertical side walls, and the electrodes are formed by a self-aligning anisotropic plasma etching process which requires no photolithography. A similar process may be used to form a fanout region for individual contacting of channel electrodes. For improved contacting, preferably the fanout region is also channelled and an upstanding structure such as columns provided in the fanout channels so that the spaces between the columns and between the columns and the side walls are filled up with deposited metal that remains following the anisotropic etching process.

28 Claims, 3 Drawing Sheets

PLASMA ADDRESSED LIQUID CRYSTAL DISPLAY WITH ETCHED ELECTRODES

RELATED APPLICATIONS

1) Application, Ser. No. 08/361,076, filed Dec. 21, 1994 (5604-0375).

2) Application, Ser. No. 08/407,536, filed Mar. 20, 1995 (5604-0379).

BACKGROUND OF INVENTION

This invention relates to electrical devices, and in particular to plasma-addressed electro-optic display panels commonly referred to as "PALC" display devices.

PALC-type display devices comprise, typically, a sandwich of: a first substrate having deposited on it parallel transparent column electrodes, commonly referred to as "ITO" columns or electrodes since indium-tin oxides are typically used, on which is deposited a color filter layer; a second substrate comprising parallel sealed plasma channels corresponding to rows of the display crossing all of the ITO columns and each of which is filled with a low pressure ionizable gas, such as helium, neon and/or argon, and containing spaced cathode and anode electrodes along the channel for ionizing the gas to create a plasma, which channels are closed off by a thin transparent dielectric sheet; and a liquid crystal (LC) material located between the substrates. The structure behaves like an active matrix liquid crystal display in which the thin film transistor switches at each pixel are replaced by a plasma channel acting as a row switch and capable of selectively addressing a row of LC pixel elements. In operation, successive lines of data signals representing an image to be displayed are sampled at column positions and the sampled data voltages are respectively applied to the ITO columns. All but one of the row plasma channels are in the de-ionized or non-conducting state. The plasma of the one ionized selected channel is conducting and, in effect, establishes a reference potential on the adjacent side of a row of pixels of the LC layer, causing each LC pixel to charge up to the applied column potential of the data signal. The ionized channel is turned off, isolating the LC pixel charge and storing the data voltage for a frame period. When the next row of data appears on the ITO columns, only the succeeding plasma channel row is ionized to store the data voltages in the succeeding row of LC pixels, and so on. As is well known, the attenuation of each LC pixel to backlight or incident light is a function of the stored voltage across the pixel. A more detailed description is unnecessary because the construction, fabrication, and operation of such PALC devices have been described in detail in the following U.S. patents and publication, the contents of which are hereby incorporated by reference: U.S. Pat. Nos. 4,896,149; 5,077,553; 5,272,472; 5,276,384; and Buzak et al., "A 16-Inch Full Color Plasma Addressed Liquid Crystal Display", Digest of Tech. Papers, 1993 SID Int. Symp., Soc. for Info. Displ. pp. 883–886.

A cross-section of the PALC display described in the 1993 SID Digest is shown in FIG. 2. The thin dielectric sheet, called from time-to-time herein the "micro-sheet", can be given a thickness in the range of 30–50 μm. It can be provided over an etched glass substrate as shown and the electrodes provided along the curved bottom surface. Alternatively, as proposed in U.S. Pat. No. 5,214,521, the electrodes can be deposited on a flat bottom plate while the top plate is etched back to form channels shaped as hemicylinders—the inverse of that shown in FIG. 2—in such a way that the remaining glass at the top of the channels is thin enough to allow addressing of the adjacent LC material. Other constructions have been proposed using vertical side walls with the electrodes deposited on the side walls facing one another, which may allow lowering of the channel height. See, for example, EP 0 567 021 A1 and the first referenced related application (Ser. No. 08/361,078 5604-0375), whose contents are herein incorporated by reference.

In all the known constructions, to the best of our knowledge, the electrodes were formed by well known photolithographic processes in which the whole surface was first covered with the electrode material, an etchant mask provided and patterned to expose all of the deposited electrode material except for the desired locations of the electrodes, and an etching step carried out with an etchant that selectively attacks the electrode material until all of the exposed latter is removed. This is an expensive and time-consuming process.

Similarly, it was known to provide on opposite sides of the panel a so-called fanout region to simplify the process of contacting individually the cathode and anode electrodes. All of the cathode electrode contact regions fanned out and widened at one side of the panel, and all of the anode electrode contact regions fanned out and widened at the opposite side of the panel. Again, the standard photolithographic process was used to make the contact regions for the cathode and anode electrodes, which added to the expense of the assembly.

SUMMARY OF INVENTION

An object of the invention is an improved contact structure for an electrical device and method of making same.

A further object of the invention is an improved channel plate and method for making same for use in a display device.

Another object of the invention is a fabrication process for a channel plate or PALC display device which avoids or minimizes the need for a conventional photolithographic process.

In accordance with a first aspect of the invention, a channel substrate is provided that comprises plasma channels defined by substantially vertical side walls for receiving the electrodes on facing surfaces. The electrode material is then deposited in the conventional way so as to cover the whole surface of the substrate. The substrate with the deposited electrode material is then subjected to a dry self-aligning etching process to remove the deposited material except at the places where the electrodes are desired. In a preferred embodiment, the dry self-aligning etching process is a known anisotropic reactive ion etching (RIE) process or plasma etching process. In such a process, the reactive ions are directed substantially perpendicularly to the substrate surface with the result that all of the deposited material that faces the oncoming ions is removed, which includes all of the deposited material that extends substantially horizontally but only a small part of the deposited material that extends substantially vertically. Hence, when the electrodes are provided on substantially vertical side walls of the channels, only the desired electrode material will remain following the anisotropic RIE process without any photolithographic steps needed.

In accordance with another aspect of the invention, a fanout region for an electrical device is configured with widened channels and side walls and a vertical structure within each widened region. When the fanout region is covered with the electrode material and subjected to an anisotropic RIE process, all of the deposited material on the mesas between the individual electrode contact regions as well as covering the tops of the vertical structure will be removed but the deposited material on the sides of the vertical structure and on the said walls of each individual fanout region will remain, forming a continuous widened contact region that is easily contacted.

The method described is especially applicable to devices that include a widened channelled fanout region with the vertical structure and with the contact regions formed by the electrode material on the side walls of the channels and the vertical structure, and the end product thus produced is also considered part of our invention.

The method described and the fanout region thus produced can also be applied to any kind of electrical device that contains closely-spaced or many electrodes that are difficult to connect to unless spread out over a wider region and is thus also considered part of our invention.

Preferably, the vertical structure is provided as a plurality of upstanding columns sized and spaced such that the vertically extending layers of electrode material that remain following the anisotropic etching step contact one another and form a continuous electrically conductive layer forming a good low resistance contact to the connected electrode in the channel region.

The process as described here is easily combined with the plasma etching process described in the second referenced related application (Ser. No. 08/407,536 5604-0379) in which a thin dielectric sheet is etched by means of a plasma etching process to form vertical side walls defining the channels. The process described herein thus offers the advantage of a self-aligned method for providing the electrodes on the side walls of each cavity formed by the plasma etching process.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

Figure 1:
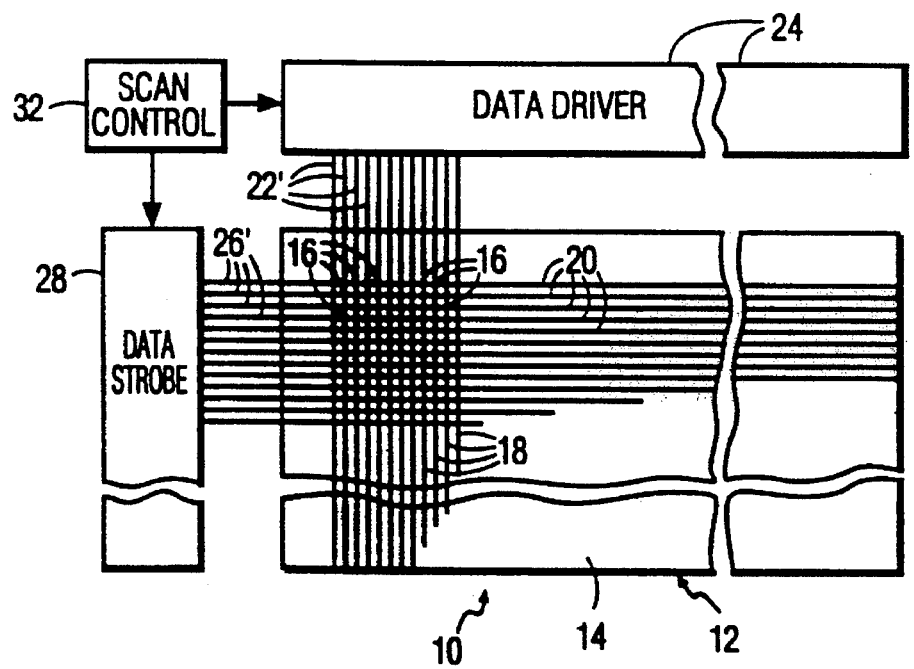
FIG. 1 is a schematic block diagram of a conventional flat panel display system.

FIG. 1 shows a flat panel display system 10, which represents a typical PALC display device and the operating electronic circuitry. With reference to FIG. 1, the flat panel display system comprises a display panel 12 having a display surface 14 that contains a pattern formed by a rectangular planar array of nominally identical data storage or display elements 16 mutually spaced apart by predetermined distances in the vertical and horizontal directions. Each display element 16 in the array represents the overlapping portions of thin, narrow electrodes 18 arranged in vertical columns and elongate, narrow channels 20 arranged in horizontal rows. (The electrodes 18 are hereinafter referred to from time to time as "column electrodes"). The display elements 16 in each of the rows of channels 20 represent one line of data.

The widths of column electrodes 18 and channels 20 determine the dimensions of display elements 16, which are typically of rectangular shape. Column electrodes 18 are deposited on a major surface of a first electrically nonconductive, optically transparent substrate 34, and the channel rows are usually built into a second transparent substrate 36. Skilled persons will appreciate that certain systems, such as reflective display of either the direct view or projection type, would require that only one substrate be optically transparent.

Column electrodes 18 receive data drive signals of the analog voltage type developed on parallel output conductors 22' by different ones of output amplifiers 23 (FIG. 2) of a data driver or drive circuit 24, and channels 20 receive data strobe signals of the voltage pulse type developed on parallel output conductors 26' by different ones of output amplifiers 21 (FIG. 2) of a data strobe or strobe means or strobe circuit 28. Each of the channels 20 includes a reference electrode 30 (FIG. 2) to which a reference potential, such as ground, common to each channel 20 and data strobe 28 is applied.

To synthesize an image on the entire area of display surface 14, display system 10 employs a scan control circuit 32 that coordinates the functions of data driver 24 and data strobe 28 so that all columns of display elements 16 of display panel 12 are addressed row by row in row scan fashion. Display panel 12 may employ electro-optic materials of different types. For example, if it uses such material that changes the polarization state of incident light rays, display panel 12 is positioned between a pair of light polarizing filters, which cooperate with display panel 12 to change the luminance of light propagating through them. The use of a scattering liquid crystal cell as the electro-optic material would not require the use of polarizing filters, however. All such materials or layers of materials which attenuate transmitted or reflected light in response to the voltage across it are referred to herein as electro-optic materials. As LC materials are presently the most common example, the detailed description will refer to LC materials but it will be understood that the invention is not limited thereto. A color filter (not shown) may be positioned within display panel 12 to develop multi-colored images of controllable color intensity. For a projection display, color can also be achieved by using three separate monochrome panels 12, each of which controls one primary color.

Figure 2:
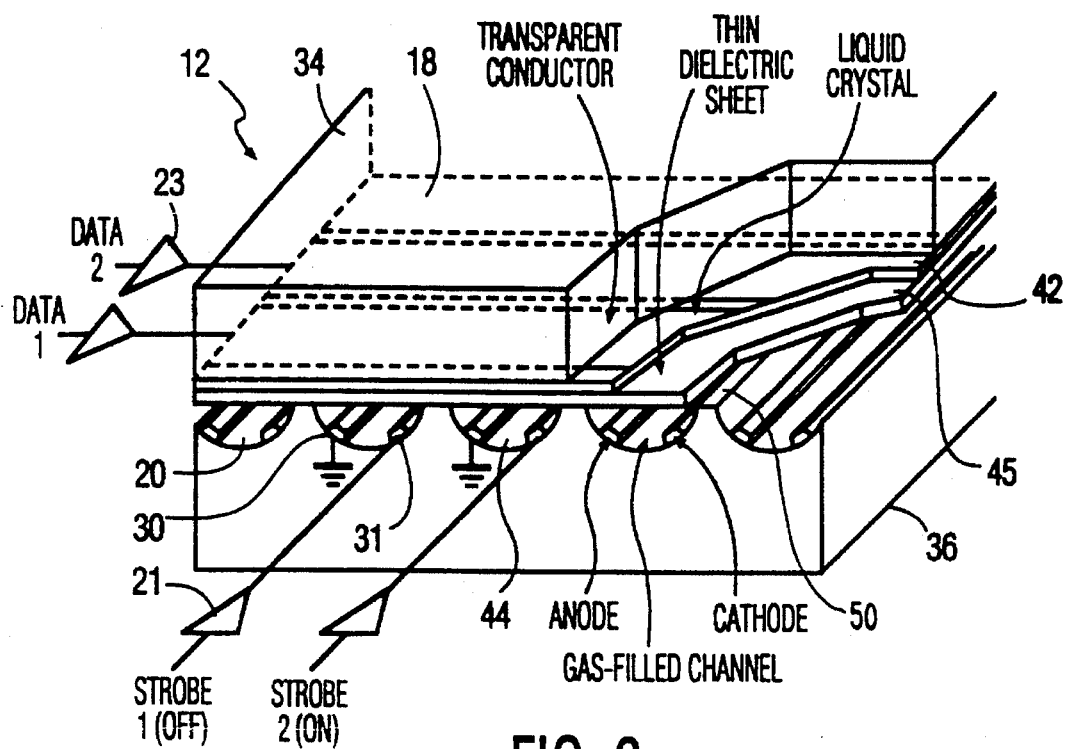
FIG. 2 is a perspective view of part of a conventional PALC display device.

FIG. 2 illustrates the PALC version of such a display panel using LC material. Only 3 of the column electrodes 18 are shown. The row electrodes 20 are constituted by a plurality of parallel elongated sealed channels underlying (in FIG. 2) a layer 42 of the LC material. Each of the channels 20 is filled with an ionizable gas 44, closed off with a thin dielectric sheet 45 typically of glass, and contains on an interior channel surface first and second spaced elongated electrodes 30, 31 which extend the full length of each channel. The first electrode 30 is grounded and is commonly called the cathode. The second electrode 31 is called the anode, because to it will be supplied relative to the cathode electrode a positive strobe pulse sufficient to cause electrons to be emitted from the cathode 30 to ionize the gas. As explained above, each channel 20, in turn, has its gas ionized with a strobe pulse to form a plasma and a grounded line connection to a row of pixels in the LC layer 42 above. When the strobe pulse terminates, and after deionization has occurred, the next channel is strobed and turned on. Since the column electrodes 18 each cross a whole column of pixels, only one plasma row connection at a time is allowed on to avoid crosstalk.

Fabrication of an PALC device is typically done as described in the 1993 SID digest paper by providing first and second substrates 34, 36 with the first substrate 34 comprising a glass panel on which is vapor-deposited the ITO column electrodes 18, followed by color filter processing over the ITO electrodes to produce the RGB stripes (not shown), followed by the black surround processing and liquid crystal alignment processing. The second substrate 36, also a glass panel, is masked and etched to form the channels 20, following which the plasma electrode material is deposited and masked and etched to form the cathode 30 and anode 31 electrodes. A thin dielectric glass microsheet 45 is then sealed across the channel ridges 50 to seal off the channels 20, which are then exhausted, back-filled with a low-pressure ionizable gas such as helium, neon, and optionally with argon and sealed off. LC alignment of the exposed surface of the microsheet 45 is then carried out. The two assembled substrates are then assembled into a panel with the two LC alignment surfaces spaced apart and facing, the LC material 42 introduced into the space, and electrical connections made to the column electrodes 18 and plasma electrodes 30, 31.

Figure 3:
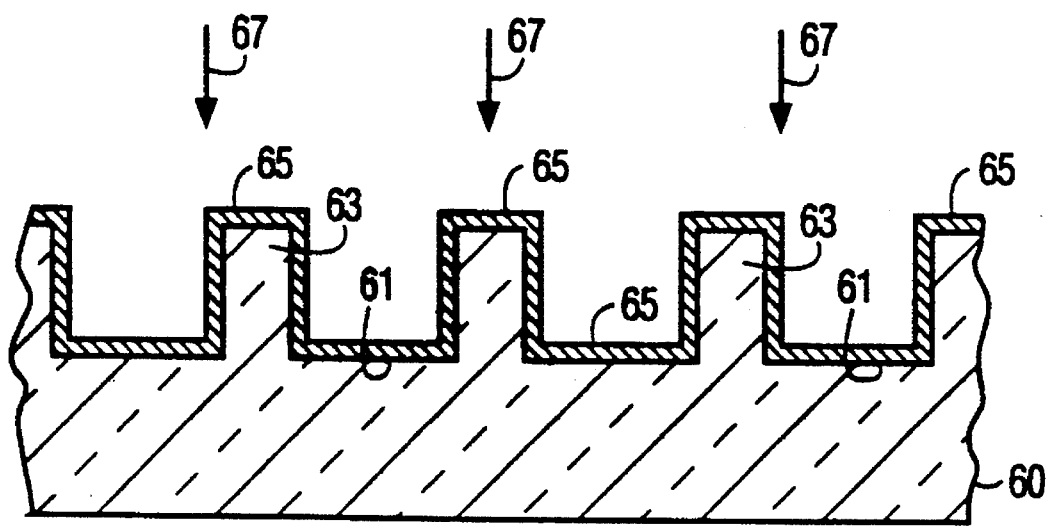
FIGS. 3 and 4 illustrate one way of fabricating a channel plate according to the invention in which the electrodes are on vertical side walls of the channel.

FIG. 3 is a cross-section of part of the plasma channel region of one form of liquid crystal display panel in accordance with the invention. As described in the second referenced related application (Ser. No. 08/407,536 5604-0379), fabrication by plasma etching of a glass substrate 60 results in glass channels 61 with nearly vertical side walls 63. A thick flat glass bottom plate 60 can form the substrate for the plasma channels 61. Alternatively, as described in the referenced EP application, the structure with nearly vertical side walls can also be formed in other ways. The electrode material, for example, of Cr-Cu-Cr, is then sputter deposited over the patterned substrate formed by the bottom and side walls of the substrate 60, 63. FIG. 3 shows the etched channels 61 and side walls 63 covered with electrode material 65 before etching of the electrodes. The electrode material is then etched anisotropically by plasma etching under standard conditions. Etching anisotropically means that the reactive ions are directed substantially perpendicularly to the surfaces of the channel bottoms and mesas formed at the tops of the side walls, vertically in FIG. 3 as shown at 67. The etching is continued until the electrode material is completely etched away from the bottoms of the channels and the tops of the mesas formed by the side walls. The selectivity difference of the metal and glass substrate to the reactive ions chosen, which is as such well known, should prevent the glass from etching. Examples of suitable etchants can be found in the second referenced related application, incorporated herein by reference, and include, for example, $CF_4$, $CHF_3$, and Ar. Other etchants which will preferentially etch the electrode material in the presence of glass can be substituted. As one example, the substrate part is placed in a conventional RIE reactor and etched under standard conditions using gasses such as $CF_4+O_2$ or $CHF_3+O_2$ and similar fluorine, chlorine or bromine compounds, with the $O_2$ typically constituting 5–30% of the gas mixture. Etch rates of ½–1 µ/m can be achieved. See "Thin Film Processes", edit. by J. L. Vossen and W. Kern, published 1978 by Academic Press, Ch. V-2, pgs. 497–556, as an example of available literature for more descriptions of different kinds of etchants that can be used for different kinds of electrode materials in various environments.

Figure 4:
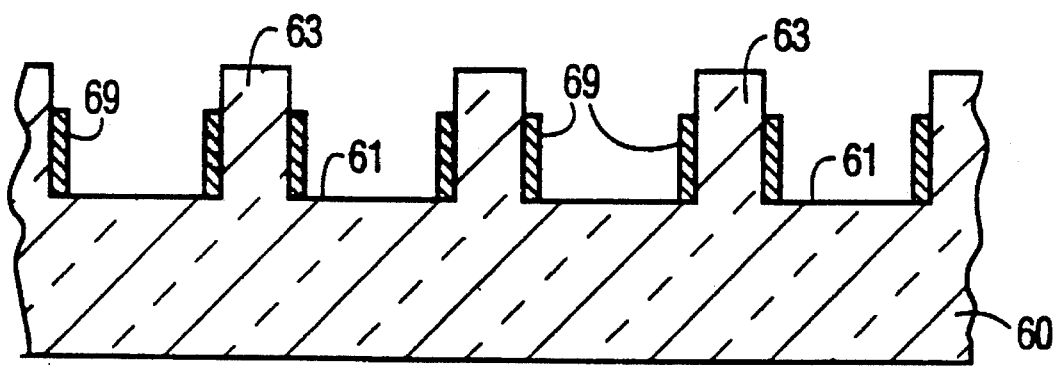

The result of the anisotropic etching process will be that the electrode material on the mesa tops and channel bottom surfaces is etched off but only a small region at the top of the electrode material that remains on the side walls of the channel. FIG. 4 shows the etched channels 61 after etching off of the electrode material leaving behind just the desired electrode portions 69 forming the desired metallized sidewalls 63. The height of the electrodes 69 with respect to the total channel depth can be controlled by longer or shorter etching. If a good selective process is chosen only electrode material is etched without attacking the glass.

The advantages of plasma etching of the glass channels as described in the related application are that nearly vertical side walls can be obtained, and there is less pollution effects as compared to wet etching. The advantages of plasma etching of the electrodes of the present invention, besides less pollution effects, is self-alignment, meaning that for this step no photolithography process is necessary.

As described above, the electrode spacing within a channel is quite small and to simplify contacting of the individual electrodes, the cathodes electrodes are extended into a fanout region where they can be widened at one side of the panel, and the anode electrodes are similarly fanned out and widened at the opposite side of the panel. In accordance with a further feature of the invention, an anisotropic dry etching process can also be used to provide the fanout region contacts without use of a photolithographic process. This is achieved in a preferred embodiment of the invention by providing channels in the fanout region for receiving the widened electrodes and providing in the fanout region channels an upstanding structure that will prevent interruption of the electrode contacts by the anisotropic etching step. The channels in the fanout region can be made by and during the same process that makes the plasma channels. The upstanding structure in a preferred embodiment can be provided by a plurality of local columns in the channel distributed in such manner that metallized side walls of the channel and the columns will remain in contact to provide the desired continuous contact region for each electrode.

Figure 5:
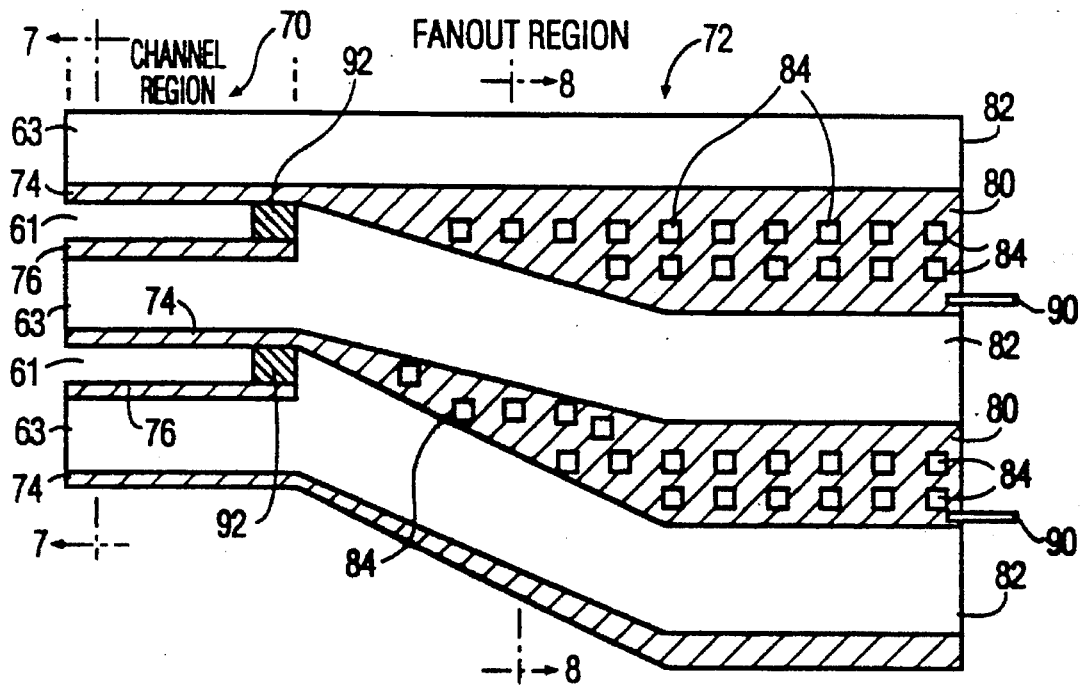
FIG. 5 is a plan view of part of one side of a channel plate according to the invention showing the adjacent fanout region.
Figure 6:
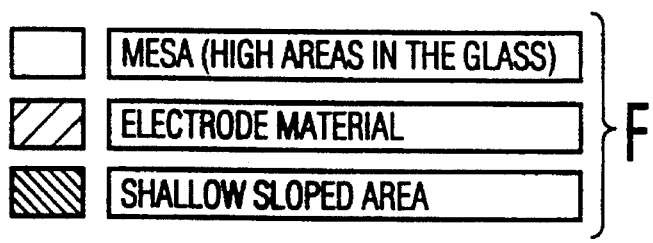
FIG. 6 provides legends showing the meaning of the different hatched regions as used in FIG. 5.

FIGS. 5–8 illustrate one form of the preferred embodiment. FIG. 5 is a plan view of one side of the channel substrate showing the ends of two channels 61 separated by the channel side walls 63 represented by the darkened area (as shown by the legends in FIG. 6), referred to as the channel region 70, adjacent to a fanout region 72. It will be understood that the actual panel would have many more channels. Each of the channels has the two cathode 74 and anode 76 electrodes. FIG. 5 shows only the fanout region 72 for the cathode electrodes but it will be understood that the not-shown anode fanout region will be similar. The fanout region 72 allows the narrow cathode electrodes 74 to exit the channel region 70 and be widened and continue as shown to provide enlarged contact regions 80 for ease of contacting. Reference numeral 90 schematically shows the contacts which also may be more widely spaced due to the fanout region. The channels 61 in the channel region are continued into the fanout region providing side walls 82 flanking and defining each cathode contact region. If the deposited electrode material were continued into a widened fanout region lacking the upstanding structure of the invention and the anisotropic etching process carried out, then the electrode material on the bottom surfaces of the widened fanout regions would also be removed leaving only the side walls 82 metallized, which would make for an undesired higher resistance contact region and also make providing contacts to the resultant narrow metallized portions very difficult.

In accordance with a feature of the invention, a plurality of columns 84 are provided in the fanout region. Preferably the columns 84 are provided by etching using the same dry etching process described above and in the related application and used to make the plasma 61 and fanout 80 channels. The columns 84 are distributed in a manner such that they are spaced no further apart from each other, as well as from the side walls 82, than twice the thickness of the deposited electrode material.

Figure 7:
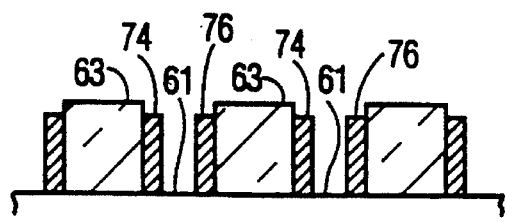
FIG. 7 is a partial cross-sectional view along the line 7—7 of FIG. 5.
Figure 8:
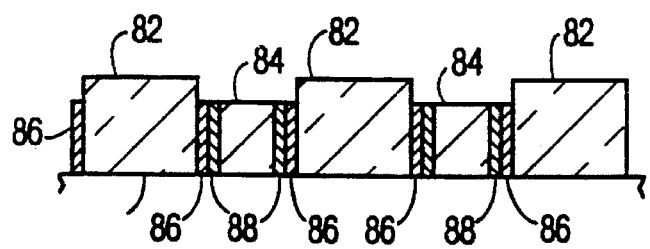
FIG. 8 is a partial cross-sectional view along the line 8—8 of FIG. 5.

FIG. 7 is a cross-section of the channel region 70 similar to that of FIG. 4 showing the side walls 63 metallized to form the electrodes 74, 76. FIG. 8 is a cross-section through the fanout region 72. The side walls flanking and defining the individual electrode contact regions 80 are shown at 82. As in the fabrication of the channel metallization, the anisotropic etching has removed all the electrode material deposited on top of the mesas over the side walls 82 as well as on top of the mesas over the columns 84. But the metallizations 86 on the fanout region side walls and the metallizations 88 on the column side walls remain. Thus the deposited conductive material after the anisotropic etching step will fill up the regions (shown in FIG. 8 at 86 and 88) between the columns and between the columns and the channel side walls providing a substantially continuous contact region, provided that the density of the columns is high enough. This is achieved when the spacing between the columns 84 and between the columns 84 and the side walls 82 does not exceed approximately twice the film thickness of the deposited electrode material. As a result, the entire electrode structure including the fanout region can be formed without the use of photolithography.

Preferably, the fanout region channels are much shallower than the channels in the channel region, preferably about the thickness of the deposited electrode material. This has not been shown in the drawings for the sake of clarity. This geometry has the advantage that the resultant metal 80 is closer to the surface of the substrate so that external connections are more easily made. To prevent inadvertent shorting of the cathode and anode electrodes and maintaining them adequately separated at the fanout region transition, shallow sloped areas designated 92 are provided between the fanout region and the channel region at each channel. If the columns 84 were omitted, then the isotropic etching process would remove the deposited metal at the bottom of the fanout channels leaving the side wall metallizations 86 intact. In such a case, while not as desirable, the fanout channels can be made deeper, for example as deep as in the channel region, and in a subsequent step an electrically conducting epoxy or paste can be introduced to fill up the fanout channels to the substrate level to simplify contacting while at the same time reducing the resistance to the channel electrodes.

It will be appreciated that the invention is not limited to the column structure 84 as illustrated and other upstanding configurations, such as rectangular, round, and even elongated or meandering, can be substituted following the principles set forth herein.

The invention is generally applicable to all kinds of PALC displays that typically have a small channel pitch for use in computer monitors, workstations or TV applications. Such displays will preferably have channel dimensions typically within the ranges stated below. In general, with a desired channel pitch p as the given, and b representing the width of the ridges formed by the side walls 63 between adjacent channels 61, and h representing the height of the channel, the preferred ranges of h and b for channels with vertical side walls, and with the electrodes on the side walls as in FIG. 4, are as follows:

(i) $0.03\ p \leq b \leq 0.1\ p$ (ii) $0.28\ p \leq h \leq 0.34\ p$

When b is chosen in the range indicated, the ridge width is kept small making for a larger aperture; when h is in the range indicated, then a shorter etch time is needed without sacrificing a stable discharge.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. In a method for making an electrical device comprising plural electrodes separately electrically connected to plural widened channel connecting regions, the connecting regions, separated by mesa regions, said method comprising the steps of:

(a) providing the plurality of widened channel connecting regions separated by mesa regions, (b) providing a layer of electrode material over the channel bottoms, over the channel walls and the mesa tops and in contact with the plural electrodes, and (c) subjecting the electrode material to anisotropic plasma etching to remove electrode material from the tops of the mesas to electrically separate the widened channel connecting regions.

2. The method of claim 1, further comprising an upstanding structure in each of the channel connecting regions.

3. In a method for making a channel plate comprising an electrode on a wall of a channel, the wall forming a mesa, said method comprising the steps of:

(a) providing a layer of electrode material over the channel bottom and the walls, and the mesa top, and (b) subjecting the layer of electrode material to an etching step to remove electrode material from the channel bottom and the mesa top, substantially leaving intact electrode material on the wall.

4. The method of claim 3, characterized in that the electrode material covers opposed walls of the channel, and the etching step is an anisotropic plasma etching process.

5. In a method for making the plasma channel plate of a plasma-addressed electro-optic display device comprising a layer of electro-optic material, data electrodes coupled to the electro-optic layer to receive data voltages for activating portions of the electro-optic layer, a plurality of elongated plasma channels separated by mesas and filled with an ionizable gas, and extending generally transverse to the data electrodes for selectively switching on said electro-optic portions, and a dielectric sheet on the mesa tops closing off the plasma channels, wherein said plasma channels each comprise an elongated cathode plasma electrode spaced from an elongated anode plasma electrode, said plasma electrodes being on substantially vertical channel walls, said method comprising the steps of:

(a) providing a layer of electrode material over the channel bottoms and walls and mesa tops, (b) subjecting the electrode material to anisotropic plasma etching to remove electrode material from the channel bottoms and mesa tops, substantially leaving intact electrode material on the walls.

6. The method of claim 5, characterized in that step (a) is carried out by vapor-depositing electrode material over each of the channels and the mesas.

7. The method of claim 5, characterized in that step (b) is carried out by an RIE etching process until all of the electrode material from the tops of the mesas and from the channel bottoms between the electrodes on the walls is removed.

8. The method of claim 5, further comprising the steps of:

(c) providing a channelled fanout region for each of the plasma electrodes, (d) providing the electrode material over each channelled fanout region, and (e) subjecting the channelled fanout regions to the anisotropic plasma etching at the same time as carrying out step (b).

9. The method of claim 8, characterized in that step (d) is carried out at the same time as step (a).

10. The method of claim 8, characterized in that, before carrying out step (d), providing in each channelled fanout region an upstanding structure with substantially vertical walls, said structure being configured such that the regions between each upstanding structure and the channelled fanout region walls is filled with electrode material that remains following step (e).

11. In a method for making the plasma channel plate of a plasma-addressed electro-optic display device comprising a layer of electro-optic material, data electrodes coupled to the electro-optic layer to receive data voltages for activating portions of the electro-optic layer, a plurality of elongated plasma channels separated by mesas and filled with an ionizable gas, and extending generally transverse to the data electrodes for selectively switching on said electro-optic portions, and a dielectric sheet closing off the plasma channels, wherein said plasma channels each comprise an elongated cathode plasma electrode spaced from an elongated anode plasma electrode, said method comprising the steps of:

(a) providing a channelled fanout region with walls for each of the plasma electrodes, each fanout region separated from adjacent fanout regions by the mesa regions, (b) providing a layer of electrode material over the channelled fanout regions and the mesa regions, (c) subjecting the channelled fanout regions and mesa regions to an anisotropic plasma etching process to remove electrode material from the tops of the mesas and from the channel bottoms.

12. The method of claim 11, characterized in that, before carrying out step (c), providing in the channelled fanout region an upstanding structure with substantially vertical walls, each structure being configured such that the regions between each upstanding structure and the channelled fanout region walls is filled with electrode material that remains following step (c).

13. A fanout region of an electrical device, comprising spaced widened channelled connecting regions separated by mesas, each connecting region having walls, and a bottom and is separately connected to an associated electrode, wherein electrode material as present on each wall of each connecting region and is connected to the associated electrode, with the channel bottoms and mesa tops being substantially free of electrode material.

14. The fanout region of claim 13, characterized in that it further comprises an upstanding structure in each of the channelled connecting regions.

15. A channel plate structure comprising spaced channels separated by mesas, each channel with substantially vertical opposed walls, and electrode material on the walls of each channel, with the channel bottoms and mesa tops being free of electrode material.

16. The channel plate structure of claim 15, further comprising means for separately contacting the electrode material on the opposed walls, said means comprising a further layer of electrode material connected to and extending from electrode material on the walls.

17. A plasma-addressed electro-optic display device comprising a layer of electro-optic material, data electrodes coupled to the electro-optic layer to receive data voltages for activating portions of the electro-optic layer, a plurality of elongated plasma channels extending generally transverse to the data electrodes for selectively switching on said electro-optic portions, a thin dielectric sheet-like member which is between the plasma channels and the electro-optic layer thereby closing off the plasma channels, said plasma channels, each comprising spaced elongated cathode and anode plasma electrodes and an ionizable gas filling the plasma channels, said device further comprising fanout regions separated by mesas for connection to the plasma electrodes, characterized in that:

(a) each fanout region comprises a channelled structure with substantially vertical walls, (b) electrode metallizations on the walls of the channelled fanout regions and connected to individual electrodes in the plasma channels, the tops of the mesas and the bottoms of the plasma channels and channeled fanout regions being substantially free from electrode metallization.

18. The device of claim 17, characterized in that each channelled structure in the fanout region is wider than the plasma channels.

19. The device of claim 18, characterized in that it further comprises at least one upstanding structure having substantially vertical walls in the channels of the channelled fanout regions which are spaced from the adjacent channelled fanout region walls, said electrode metallizations substantially filling the spaces between the upstanding structure walls and the adjacent channelled fanout region walls.

20. The device of claim 19, characterized in that each upstanding structure comprises a plurality of spaced columns.

21. The device of claim 20, characterized in that the columns are spaced from one another and from the adjacent channelled fanout region walls by a spacing substantially no greater than twice the thickness of the electrode metallizations.

22. The device of claim 17, characterized in that each channelled fanout region has a shallower channel than that of the plasma channels.

23. The device of claim 17, characterized in that shallow sloped areas are provided where the plasma channels transit to the channelled fanout regions to separate the cathode and anode electrodes.

24. The device of claim 17, characterized in that the channelled fanout regions is substantially as deep as the plasma channels, and a conductive material fills the spaces in the channels of the channelled fanout region between the walls.

25. The device of claim 17, characterized in that the plasma channels comprise substantially vertical walls with the electrodes located on facing surfaces of the walls.

26. The device of claim 17, characterized in that the plasma channels are formed by a glass substrate with etched trough-like cavities.

27. The device of claim 26, characterized in that the fanout region channels are formed by a glass substrate with etched trough-like cavities forming the side walls.

28. The device of claim 20, characterized in that the fanout region channels and columns are formed by a glass substrate with etched trough-like cavities.

* * * * *